US006335207B1

(12) United States Patent
Joo et al.

(10) Patent No.: US 6,335,207 B1
(45) Date of Patent: Jan. 1, 2002

(54) METHOD FOR FABRICATING FERROELECTRIC THIN FILM

(75) Inventors: Seung Ki Joo, Sampoong Apt. 22-201, 1685 Seocho-dong, Seocho-ku, Seoul; Jang Sik Lee, Pusan; Eung Chul Park, Seoul, all of (KR)

(73) Assignee: Seung Ki Joo, Seoul (KR)

( * ) Notice: Subject to any disclaimer, the term of this patent is extended or adjusted under 35 U.S.C. 154(b) by 0 days.

(21) Appl. No.: 09/749,762

(22) Filed: Dec. 28, 2000

(30) Foreign Application Priority Data

Jul. 26, 2000 (KR) .............................................. 00-43139

(51) Int. Cl.[7] ................................................ H01G 7/06
(52) U.S. Cl. .......................................... 438/3; 438/240
(58) Field of Search .............................. 438/3, 240–241

(56) References Cited

U.S. PATENT DOCUMENTS

| 4,391,901 A | * | 7/1983 | Land et al. ................. 430/495 |
| 5,043,049 A | * | 8/1991 | Takenaka ..................... 204/192 |
| 5,817,532 A | * | 10/1998 | Joo et al. ........................ 438/3 |
| 6,194,229 B1 | * | 2/2001 | Basceri .......................... 438/3 |

* cited by examiner

Primary Examiner—Jey Tsai
(74) Attorney, Agent, or Firm—Rosenberg, Klein & Lee

(57) ABSTRACT

A method for fabricating a ferroelectric thin film, capable of preventing degradation due to fatigue and aging of a ferroelectric thin film of PZT and enabling crystallization at a low temperature. The ferroelectric thin film fabrication method includes the steps of forming an insulation layer on one side of a semiconductor substrate, forming an electrode layer on the insulation layer, forming a ferroelectric layer on the electrode layer, and performing an ion damage processing on the ferroelectric layer using an ionized gas.

11 Claims, 4 Drawing Sheets

METHOD FOR FABRICATING FERROELECTRIC THIN FILM

BACKGROUND OF THE INVENTION

1. Field of the Invention

The present invention relates to a ferroelectric thin film element fabrication method, and more particularly, to a method for fabricating a ferroelectric thin film, capable of preventing degradation due to fatigue and aging of a ferroelectric thin film of PZT and enabling crystallization at a low temperature.

2. Description of the Related Art

In general, PZT ($PbZr_xTi_{1-x}O_3$) that is a perovskite ferroelectric material possesses excellent piezoelectric and ferroelectric properties. Thus, PZT is widely used for various semiconductor devices.

Recently, PZT applications are actively under study as in a FRAM (Ferroelectric Random Access Memory) for storing information by using polarization of PZT and a DRAM (Dynamic Random Access Memory) using a high dielectric constant of PZT deposited in the form of a thin film by means of sputtering, CVD, sol-gel, and so on.

However, applications of PZT have been limited owing to fatigue that makes polarization lower whenever a process of storing and reading information is repeated, aging that degrades properties as time passes, a low breakdown electric field and a high leakage current.

Attempts to reduce fatigue are made using an oxide electrode such as a $RuO_2$ electrode instead of a Pt electrode, in which case a leakage current relatively increases.

Also, in the case of Bi group ferroelectric materials such as SBT ($SrBi_2Ta_2O_9$) that are vividly under study for fabrication of a memory device together with PZT, degradation is not severe as PZT, but a high temperature for crystallization more than 700° C. is required.

A low temperature process for preventing oxidation of a diffusion barrier and a uniform and fine grain size of a ferroelectric thin film for a uniform property of each element are required in addition to an excellent electric property in order to apply the ferroelectric thin film to a memory device.

Generally, a substrate should be heated higher than 300° C., then PZT is deposited thereon, and a proper post-thermal treatment should be performed with a tubular furnace or a rapid thermal treatment apparatus after deposition when a PZT thin film is made to a perovskite phase having a polarization feature.

SUMMARY OF THE INVENTION

To solve the above problems, it is an object of the present invention to provide a ferroelectric thin film fabrication method capable of making a non-volatile memory device using an existing memory production facility, in which excellent polarization is maintained even after undergoing a number of cycles and a little amount of leakage current occurs using a ferroelectric thin film.

To accomplish the above object of the present invention, there is provided a ferroelectric thin film fabrication method comprising the steps of: forming a ferroelectric layer on one side of a semiconductor substrate; and performing an ion damage processing on the ferroelectric layer using an ionized gas.

A p-type or an n-type silicon substrate is used as the semiconductor substrate. The insulation layer is made of a silicon oxide layer produced by thermally oxidizing the silicon substrate. The electrode layer is made of platinum (Pt). The Pt layer is deposited with a thickness of 2000 Å on the semiconductor substrate whose temperature is maintained at 350° C. and the Pt layer is deposited using a DC sputtering method with an argon gas.

The ferroelectric thin film fabrication method further comprises the step of forming an insulation layer on the side of the semiconductor substrate, prior to forming the ferroelectric layer.

The ferroelectric thin film fabrication method preferably further comprises the step of forming an electrode layer on the insulation layer, prior to forming the ferroelectric layer.

In addition, according to the invention, the electrode layer may be composed of at least one selected from the group consisting of Pt, Ir, $IrO_2$, Ru, and $RuO_2$.

The gas is made of one selected from the group consisting of argon, oxygen, nitrogen and hydrogen.

The ferroelectric layer is made of a ferroelectric material of $ABO_3$ perovskite composite, in which A is made of at least one selected from the group consisting of lead (Pb), barium (Ba), and strontium (Sr), and B is made of at least one selected from the group consisting of zirconium (Zr), titanium (Ti), lanthanum (La), and tungsten (W). The ferroelectric layer is formed with a thickness of 3000 Å in which the A and B metal targets are used and deposited with a reactive sputtering method using oxygen and argon gas. Before forming the ferroelectric layer, pre-sputtering is performed for 15–25 minutes using pure argon and then longer than 10 minutes using a mixture gas of oxygen and argon, thereby saturating surface oxidation of the target and making a deposition rate uniform.

The ferroelectric thin film layer may be also made of a ferroelectric material of $A'BibMcO_{(2+3b+5c)/2}$, in which A' is Ba, Sr or Pb and M is Ti, Ta or Nb.

In addition, the ferroelectric layer is $Bi_{4-x}La_xTi_3O_{12}(x=0~4)$.

The ferroelectric layer is formed by sol-gel process, sputtering process metal-organic chemical vapor deposition (MOCVD) process, or metal-organic decomposition (MOD) process.

At the ion damage processing step, the ion damage processing is performed using an ion mass doping system, in which an initial vacuum is maintained at $5 \times 10^{-6}$ torr, to thereby prevent an accelerated ion from scattering before reaching a test piece. After performing the ferroelectric ion damage processing, a post-annealing is performed at 300~800° C. in an oxygen atmosphere.

As described above, the present invention performs an ion damage processing on a ferroelectric thin film such as PZT, to thereby enhance electrical properties such as polarization, fatigue, aging, leakage current and breakdown electric field. In particular, the present invention provides an advantage in productivity since crystallization can be made at low temperature.

BRIEF DESCRIPTION OF THE DRAWINGS

The object and other advantages of the present invention will become more apparent by describing in detail the structures and operations of the present invention with reference to the accompanying drawings, in which.

DETAILED DESCRIPTION OF THE EMBODIMENTS

A preferred embodiment of the present invention will be described in detail with reference to the accompanying drawings.

In general, a ferroelectric thin film has a columnar grain structure. Here, grain boundaries arranged perpendicular to an electrode function as a diffusion path of oxygen vacancy, to thereby further accelerate fatigue. Since an exclusion of grain boundaries according to a selective nucleation and growth method can remove the above degradation factor, a thin film characteristic can be enhanced but an additional mask process and etch process should be introduced for forming a nucleation site in an actual process, thereby causing a complicated process and reducing yield (U.S. Pat. No. 5,817,532).

Thus, in order to solve both the processing problem and the grain-boundary characteristics, the present invention provides a method for suppressing a grain-boundary effect efficiently through the adjustment of microstructure of ferroelectric thin films.

In order to make the grain size fine, a high nucleation rate and a low grain growth rate are required. In order to obtain a low grain growth rate, a phase transition should occur at a lower temperature.

However, if a thermal treatment temperature decreases, a nucleation rate also decreases. As a result, a phase transition does not occur well. Therefore, an artificial manipulation is required for enabling nucleation even at a low temperature.

In the present invention, an ion damage processing is performed on the PZT thin film with argon ions according to the above-described manipulation. That is, the argun ion damage processing introduces a micro-vacancy or a crystalline defect into the PZT thin film, thereby increasing internal energy and decreasing activation energy necessary for phase transition through the increased internal energy to attempt to decrease a crystallization temperature, and thereby finding out a microstructure and an electrical characteristic of the PZT thin film having a fine grain size fabricated at a low temperature, to attempt to estimate an applicability in an actual process.

In the present invention, an experimental test has been performed in the following method, in order to estimate an influence of the above-described argon ion damage processing on the crystallization of the PZT thin film.

A three-gun magnetron sputtering apparatus has been used in order to deposit platinum or a PZT thin film on a Si substrate. A test piece holder has been located on the center of a concentric circle formed by the center of each gun, in order to minimize an effect of an ion collision, and made to be heated up to 500° C. at maximum using a contact heating type heater. Using a rotary pump and a diffusion oil pump, an initial vacuum of $1 \times 10^{-6}$ torr at maximum can be obtained. The test piece holder can be rotated in order to deposit a uniform thin film.

Figure 1:
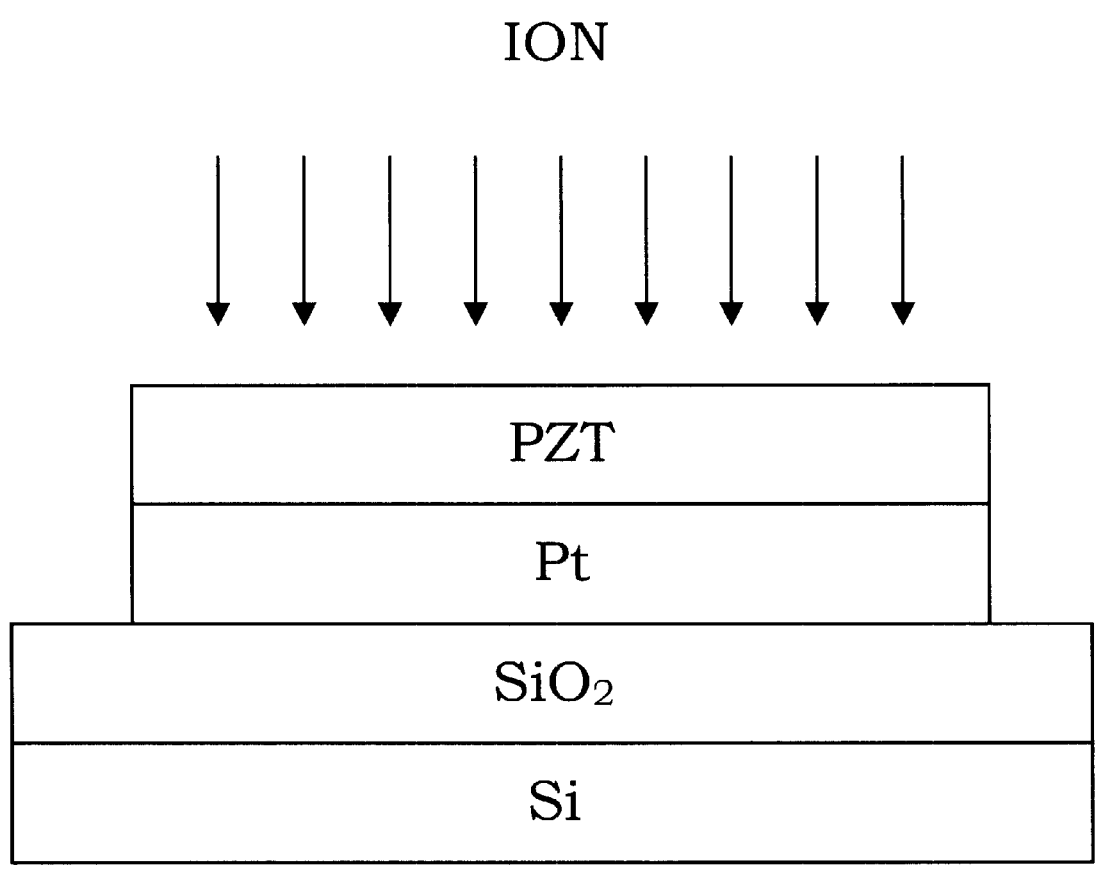
FIG. 1 is an exemplary cross-sectional view for explaining a method for performing an ion processing method on a PZT thin film, in order to fabricate a ferroelectric thin film element according to the present invention.

As shown in FIG. 1, in the case of a substrate according to the present invention, a p-type Si wafer is thermally oxidized to then form a $SiO_2$ film of 5000 Å. Thereafter, the substrate has been washed for ten minutes in a 1:1 solution of $H_2SO4$ and $H_2O_2$, and for ten seconds in a buffered HF solution.

In the case of a Pt (platinum) thin film, Pt is deposited in a DC magnetron sputtering method using pure argon gas. During deposition, the substrate has been maintained at 350° C.

The initial vacuum has been made at $5 \times 10^{-6}$ torr or less. During deposition, a processing pressure has been maintained at 20 mTorr using a mass flow controller and a conduction valve.

In the case of a PZT thin film, multi-metal targets of Pb, Zr and Ti have been used for deposition with a reactive sputtering method using oxygen and argon.

A ratio of oxygen and argon has been made 9:1 using a mass flow controller. During deposition, a processing pressure has been maintained at 20 mTorr.

Here, pre-sputtering of each test piece has been performed for twenty minutes using pure argon and for ten minutes or more using a mixture gas of oxygen and argon, to thereby saturate surface oxidation of the target at the time of the reactive sputtering to then maintain a deposition rate to be constant.

By adjusting power applied to each target, a composition of Pb/(Zr+Ti) has been changed to become about 1.2 and a ratio of Zr and Ti, that is, a composition of Zr/(Zr+Ti) has been changed to become about 0.7. The deposition condition of the PZT thin film is illustrated in the following Table 1.

TABLE 1

| Substrate | | Pt (2000Å)/ $SiO_2$ (5000Å)/Si |
|---|---|---|
| Deposition temperature | | 350° C. |
| Gas flow | | Ar (1 sccm) + $O_2$ (9 sccm) |
| Processing pressure | | 20 mTorr |
| Power | Pb | RF 30W |
| | Zr | RF 80W |
| | Ti | RF 320W |

In the ion damage processing method used in the present invention, the ion damage processing has been performed to make grain size fine, by using an ion mass doping system used in a semiconductor manufacturing process.

Here, the ion mass doping system is an apparatus for accelerating ions in one direction by applying RF (radio frequency) power to a plasma generator and then applying a high DC voltage between two grids.

The distance between a test piece and an accelerating grid has been fixed to 3 cm. A uniform ion damage processing has been performed by rotating the test piece holder.

An initial vacuum in the ion damage processing has been maintained at $5 \times 10^{-6}$ torr, in order to minimize a phenomenon that an accelerated ion is scattered before reaching the test piece.

In the ion damage processing, plasma has been generated using pure argon, oxygen, nitrogen, and hydrogen gas and so on of 99.99% purity, in which case the RF power has been fixed to 200 W and the DC accelerating voltage has been changed to control the ion damage degree.

The condition of the ion damage processing is illustrated in the following Table 2.

TABLE 2

| Base pressure | ~$10^{-6}$ torr |
|---|---|
| Gas flow | 3 sccm |

TABLE 2-continued

| | |
|---|---|
| Processing pressure | ~$10^{-3}$ torr |
| Substrate rotation rate | 5 rpm |
| RF power | 200 W |
| DC voltage | 15 kV |
| Ionic current | 5 mA |

Post-annealing of the PZT thin film has been performed in which case temperature has been changed in the range of 500–600° C. at the oxygen atmosphere.

The composition of the PZT thin film has been identified by an EDS (Energy Dispersive Spectroscopy) and an AES (Auger Electron Spectroscopy), and the microstructure of the PZT thin film has been examined by an optical microscope and an SEM (Scanning Electron Microscope).

The thickness of the PZT thin film has been measured by an α-step and the SEM, and a surface roughness has been analyzed using an AFM (Atomic Force Microscopy).

A phase formation has been observed using an X-ray diffractometer (XRD). In order to measure an electrical characteristic, a platinum upper electrode has been formed using a lift-off method or a shadow mask.

The polarization of the PZT thin film has been measured using an RT66A tester of Radiant Technology, which is used for testing polarization properties of the ferroelectric material. The leakage current of the thin film has been measured using HP4140B pA meter being leakage current measuring equipment of HP Inc.

The fatigue has been measured while changing the frequency from 1 kHz to 2 MHz using the above RT66A and a function generator.

Since argon is an inert gas, massive and easily ionized, if an IMD (Ion Mass Doping) is performed on the PZT thin film using argon plasma, an ion damage can be applied efficiently while excluding other chemical reactions. An accelerated argon ion can induce a physical crystalline defect in the PZT thin film of pyrochlore phase during collision, which induces an effect of increasing free energy of the thin film.

Figure 2:
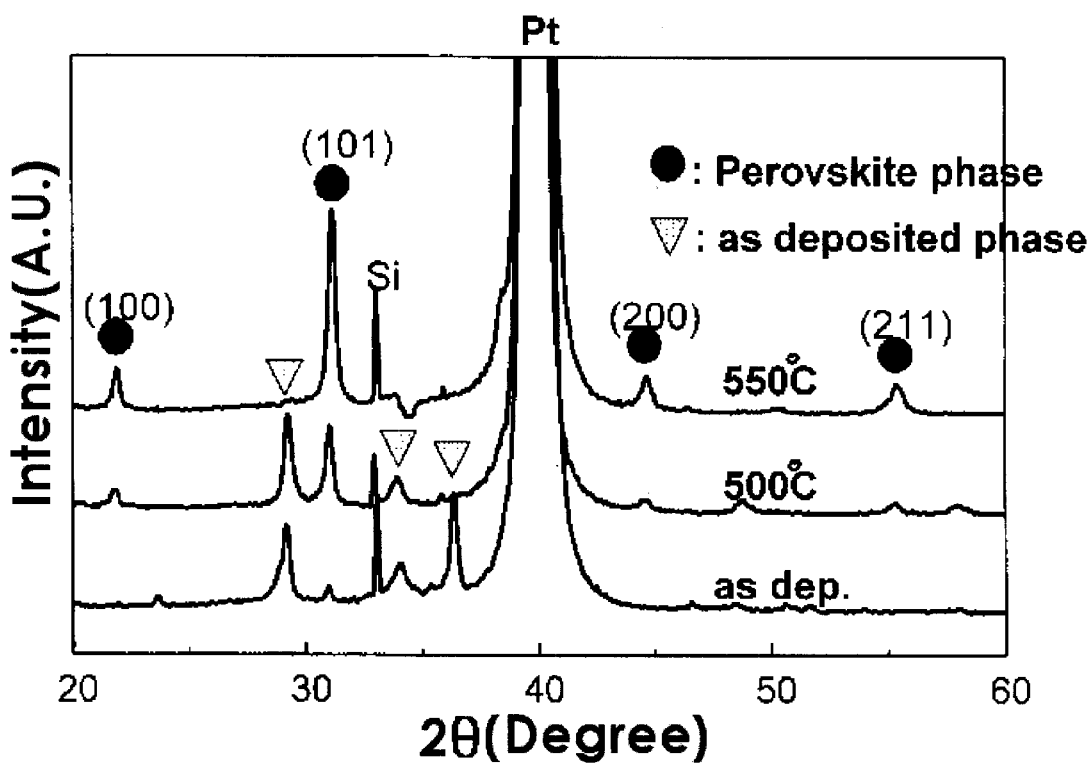
FIG. 2 is a graph for explaining X-ray diffraction patterns illustrating crystallization phases of the PZT thin film subjected to an ion damage processing.

The increase in the free energy of the pyrochlore phase makes activation energy necessary for phase transition to perovskite phase at the time of the post-annealing, to thereby cause reduction in the crystallization temperature (see FIG. 2).

In the case that a thermal treatment has been performed for three hours at 550° C., the PZT thin film having undergone the ion damage processing at the accelerating voltage of 5 kV or less has not been changed into the perovskite structure, but the PZT thin film having undergone the ion damage processing at the accelerating voltage of 10 kV has started to reveal the perovskite structure of (110) plane, however, the main phase was pyrochlore. In the case that ion damage has been performed at an accelerating voltage of 15 kV, the whole pyrochlore phase has been changed into the perovskite structure.

In the case that a thermal treatment has been performed for three hours at 550° C., the PZT thin film having undergone no ion damage processing has not been changed, but the PZT thin film having undergone the ion damage processing at the accelerating voltage of 5 kV has started to produce a small nucleus of 1 μm or less.

In the result of the XRD, no change to the perovskite phase has been observed. The reason may reside in the fact that an amount of the phase change into the perovskite phase is too little.

In the case that an ion damage processing has been performed at an accelerating voltage of 10 kV, the perovskite phase of 1 μm or less has been observed very densely, but the pyrochlore phase which has not been changed in phase still remains. In the case that an ion damage processing has been performed at an accelerating voltage of 15 kV, a phase change into the PZT thin film having the perovskite structure including very fine grains has been completed.

When comparing the cases that the PZT thin films having undergone an ion damage processing at a respective accelerating voltage of 5 kV and 10 kV have been thermally treated for three hours at 550° C. with each other, as the accelerating voltage during the ion damage processing becomes higher at the time of phase changing to the perovskite structure, the number of produced nucleus of the perovskite phase increases.

In the case that an ion damage processing has been performed with 10 kV or higher, the perovskite phase has revealed minutely. The reason is that the nucleation rate is remarkably increased in comparison with the growth rate, to thereby make the collision distance with the adjacent rosette shortened during growing from the produced nucleus.

It can be seen from this point of view that as an accelerating voltage increases when an ion damage processing is performed, the nucleation rate increases and the growth rate is not greatly changed.

If an ion damage processing time increases, the size of the rosette formed at the crystallization process is sharply reduced. If the ion damage processing time becomes five minutes or longer, the rosette cannot be observed with an optical microscope.

In general, when the PZT thin film of the pyrochlore phase formed on the platinum electrode is crystallized by thermal treatment, it has been known that the nucleus is produced at the interface of the PZT thin film and the platinum electrode and grows in the form of a hemisphere, and the surface of the nucleus contacts the surface of the PZT thin film and then continuously grows in the form of a disc, that is, a rosette.

Generally, it has been known that the PZT thin film has a columnar grain structure, but it can be seen that the PZT thin film having undergone the ion damage processing has fine grains arranged in a granular form having an average grain size of about 300 Å or so.

This means that the nucleation is generated in the whole thin film rather than the interface of PZT/Pt, and the nucleation positions can be provided in the thin film by ion damage processing.

In the case that an ion damage processing has been performed at an accelerating voltage of 10 kV or less and then thermally treated for three hours at 550° C., the phase has not been changed into the perovskite structure, to accordingly reveal no polarization. However, in the case that an ion damage processing has been performed at an accelerating voltage of 15 kV, a typical polarization of a ferroelectric material has been revealed even under the same thermal treatment condition, and a high remanent polarization value of 30.51 μC/cm² has been obtained.

Figure 3:
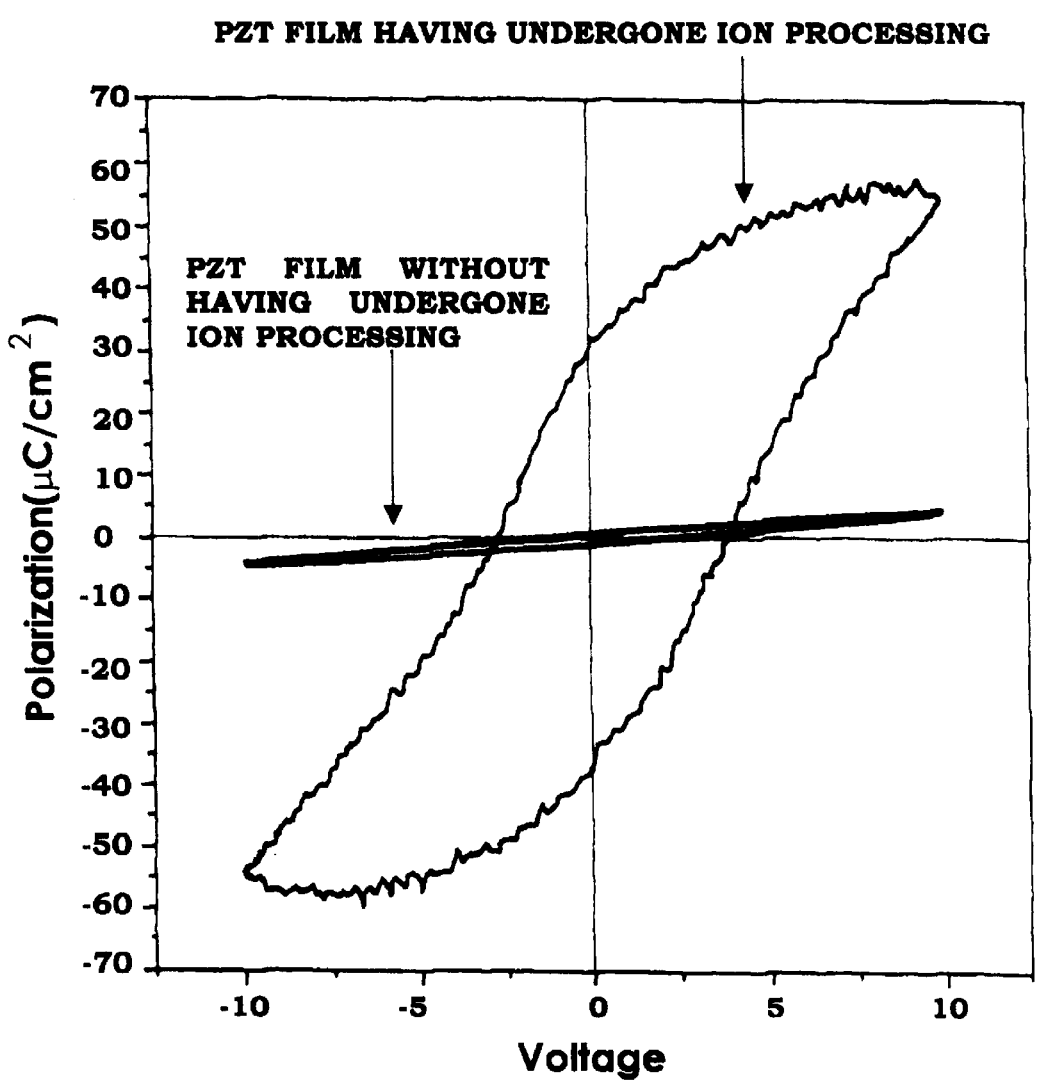
FIG. 3 is a graph for explaining ferroelectric characteristics of the PZT thin film subjected to an ion damage processing.

Referring to FIG. 3, in the case of the PZT thin film without having undergone an ion damage processing, crystallization is not well performed at 550° C., to thereby not reveal a ferroelectric characteristic. Meanwhile, in the case of the PZT thin film having undergone an ion damage processing, a ferroelectric characteristic of an excellent squareness has revealed.

Meanwhile, a low leakage current is required in addition to a high remanent polarization value in order to apply the ferroelectric material to a non-volatile memory device.

In general, if an ion damage processing is applied in the dielectric thin film, trap sites increase in the thin film and thus the leakage current increases. However, since a thermal treatment has been performed for three hours at 550° C. in the present invention, it has been observed that most of the trap sites have been removed and a phase change into the perovskite phase has completed and then the leakage current has not been nearly increased.

Even in the case that an ion damage processing has been performed with an applied voltage of 15 kV, it can be seen that there is no great difference in the leakage current from the case without having undergone the ion damage processing. At the operating voltage of 5 V, it can be seen that a value of $1.05 \times 10^{-6}$ A/cm$^2$ has been well met.

Since the accelerating voltage determines the energy of the colliding ion and the ion damage processing time determines a quantity of ions in the ion damage processing, crystallization phase and electrical characteristic have been estimated while changing the ion damage processing time in order to observe an effect on the basis of an amount of the ion damage.

In the case of the PZT thin film, it can be seen that a peak of the pyrochlore phase has been greatly observed and the peak of the pyrochlore phase has been reduced sharply according to an increase in the ion damage processing time. This means that the thin film becomes amorphous by the ion damage processing.

If these test pieces have undergone a thermal treatment for three hours at 550° C., on the one hand all the test pieces having undergone an ion damage processing for five minutes or longer have completed to be phase changed into the perovskite phase, and on the other hand the test pieces having undergone an ion damage processing for two minutes have revealed a mixture of the pyrochlore phase and the perovskite phase. In the result of measuring a P-E curve with respect to the above test pieces, the case having undergone an ion damage processing for five minutes has revealed a high remanent polarization value and a typical polarization characteristic, but the case having undergone an ion damage processing for ten minutes has revealed a somewhat reduced polarization value, and the case having undergone an ion damage processing for twenty minutes or longer has revealed a greatly reduced polarization characteristic since a leakage component has increased.

In the result of measuring an I-V characteristic with respect to each test piece in order to investigate an increase in the leakage current more accurately, there has been no big difference in comparison with the case without having undergone an ion damage processing up to the ion damage processing time of ten minutes. However, in the case that the ion damage processing time has been twenty minutes, current rapidly has increased at a lower voltage and then an insulation breakdown has occurred in a low electrical field of 373 kV/cm.

This is because the damage class of the crystal defect introduced into the thin film is greatly increased while the ion damage processing time becomes longer and thus healing is not completed at a low temperature of 550° C.

That is, the ion damage introduced into the thin film reveals both the effects of assisting crystallization and inducing the damage such as the crystal defect simultaneously. It can be seen that the optimal conditions exist according to the above two effects in order to form the PZT thin film having excellent characteristics at a low temperature.

In the present invention, the PZT thin film having the most excellent electrical characteristic at the low temperature of 550° C. can be obtained in the case that an ion damage processing is performed for five minutes at 15 kV. The fatigue with respect to the test piece is illustrated in FIG. 4, in comparison with the fatigue of the PZT thin film fabricated without having undergone the ion damage processing.

Figure 4:
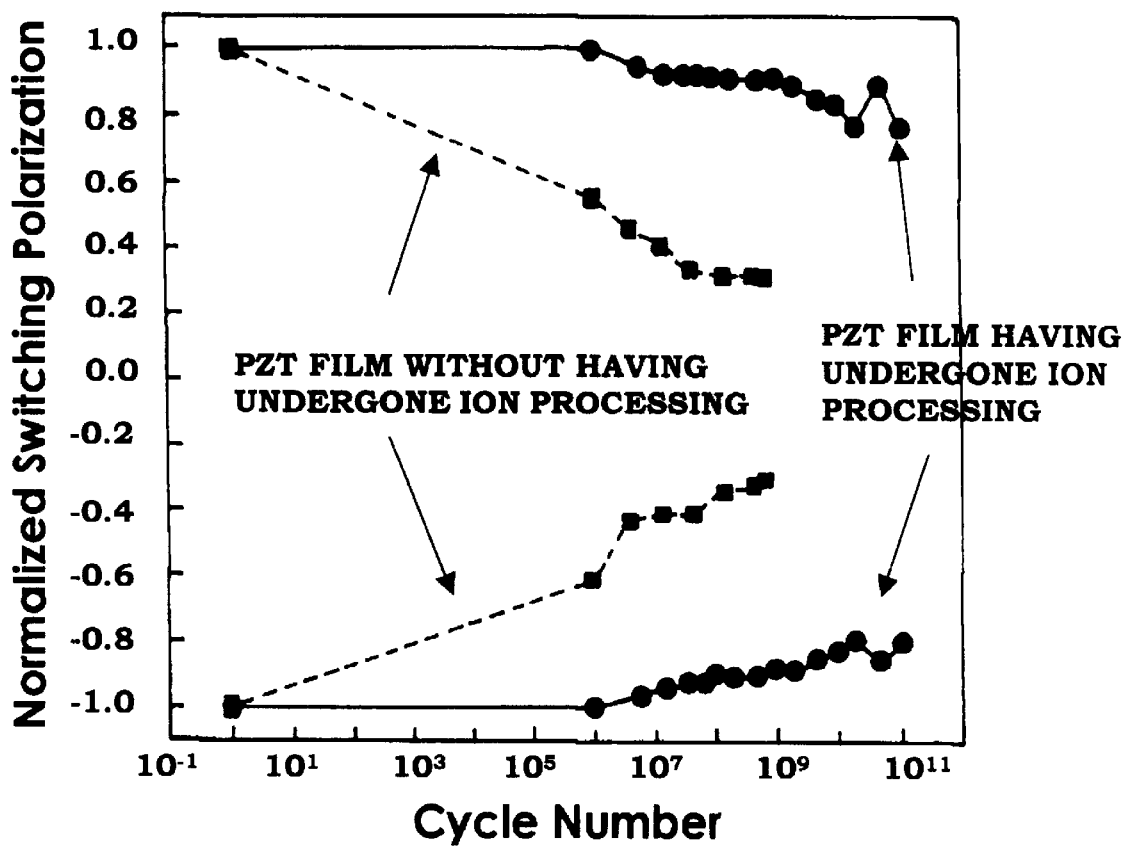
FIG. 4 is a graph for explaining fatigue characteristics of the PZT thin film subjected to an ion damage processing.

As shown in FIG. 4, in the case of the PZT thin film fabricated without having undergone an ion damage processing, a reduction in a polarization value of about 68.5% or so occurs after $6.37 \times 10^8$ cycles. Meanwhile, in the case of the PZT thin film fabricated by the ion damage processing, a reduction in the polarization value of 22% occurs even after $1.09 \times 10^{11}$ cycles. Ogata et al. (Ogata K. Suenaga K. Horikoshi K. Yoshizumi K. Kato H. Mori M., "Effect of grain size on degradation of Pt/PLZT/Pt capacitor", Gordon & Breach. Ferroelectrics, vol.225, no.1–4, 1999, pp.163–70. Switzerland.) has reported that a fatigue characteristic is greatly enhanced according to an enhanced surface roughness as the size of the crystal grain is smaller, and if the size of the crystal grain becomes 1500 Å or less the fatigue is not severe even after $10^9$ cycles. Also, Hagenbeck et al. (Hagenbeck R. Waser R. "Influence of temperature and interface charge on the grain-boundary conductivity in acceptor-doped SrTiO$_3$ ceramics" Journal of Applied Physics, vol.83, no.4, Feb. 15, 1998, pp.2083–92) have investigated the relationship between the movement of the oxygen vacancy and the size of the crystal grain, to resultantly find that as the size of the crystal grain is smaller the crystal grain system arranged in the perpendicular direction to the moving direction of the oxygen vacancy suppresses the movement of the oxygen vacancy. According to the above theory, the crystal grain system arranged in the perpendicular direction to the electric field remarkably reduces an ion conductivity of the whole thin film due to an overlapping effect of the depletion layers by space charges.

If the size of the crystal grain becomes 400–900 Å, it has been known that the above condition has been met. In the case of the present invention, the size of the crystal grain is reduced into 300 Å according to a low growth rate due to a thermal treatment at a high nucleus production rate and low temperature if an ion damage processing has undergone, which meets the above condition.

Meanwhile, in the case of the PZT thin film having undergone an ion damage processing, the fine crystal grains have been uniformly distributed in a granular form over the whole thin film of 3000 Å thick, to thereby have revealed a mixture of the vertically arranged crystal grain system and the horizontally arranged crystal grain system, in which case a crystal defect such as oxygen vacancy diffusion along the horizontally arranged crystal grain system is suppressed by the vertically arranged crystal grain system. As a result, a fatigue characteristic can be greatly enhanced.

In general, the reason why a grain boundary as a diffusion path of the oxygen vacancy and the crystal defect to thereby accelerate a fatigue phenomenon further, is because most of the thin films is formed of a columnar structure. In the present invention, the reason why the fatigue is enhanced by the ion damage processing is because the ion conductivity decreases according a decrease in the size of the crystal grain and the structure is changed into the microstructure of the granular form.

A decrease in the crystallization temperature through an ion damage processing has an advantage in a processing stability such as selection of the diffusion barrier in an integration process other than the change of the microstructure.

Meanwhile, in order to investigate an effect according to the kind of the gas used for performing an ion damage processing, an experiment using oxygen and hydrogen other than argon has proceeded in the same manner as that of an ion damage processing with the argon gas.

As a result, in the case of oxygen and hydrogen, it can be seen that the phase has been changed into the perovskite phase after performing a thermal treatment at 550° C.

As described above, the present invention performs an ion damage processing on a ferroelectric thin film such as PZT, to thereby enhance the electrical characteristics such as polarization, fatigue, aging, leakage current and breakdown electric field and provide a productivity advantage since crystallization can be performed at a lower temperature.

As described above, the present invention has been described according to preferred embodiments. However, the present invention is not limited to the particularly preferred embodiments. It is apparent to one skilled in the art that there are many various modifications and variations without departing off from the spirit or the technical scope of the appended claims.

What is claimed is:

1. A ferromagnetic thin film fabrication method comprising the steps of:

forming a ferroelectric layer on one side of a semiconductor substrate;

performing an ion damage processing on the ferroelectric layer using an ionized gas, the ion damage process resulting in an increase of internal energy of the ferroelectric layer while prohibiting a chemical reaction between the ionized gas and the ferroelectric layer; and, performing an annealing process on the semiconductor substrate and ferroelectric layer at 300° C.–800° C.

2. The ferroelectric thin film fabrication method of claim 1, wherein a p-type or an n-type silicon substrate is used as the semiconductor substrate.

3. The ferroelectric thin film fabrication method of claim 1, further comprising the step of forming an insulation layer on the side of the semiconductor substrate, prior to forming the ferroelectric layer.

4. The ferroelectric thin film fabrication method of claim 3, further comprising the step of forming an electrode layer on the insulation layer, prior to forming the ferroelectric layer.

5. The ferroelectric thin film fabrication method of claim 4, wherein the electrode layer is composed of at least one selected from the group consisting of Pt, Ir, $IrO_2$, Ru and $RuO_2$.

6. The ferroelectric thin film fabrication method of claim 1, wherein the gas is made of at least one selected from the group consisting of argon, nitrogen, oxygen and hydrogen.

7. The ferroelectric thin film fabrication method of claim 1, wherein the ferroelectric layer is made of a ferroelectric material of $ABO_3$ perovskite composite, in which A is made of at least one selected from the group consisting of lead (Pb), barium (Ba), and strontium (Sr), and B is made of at least one selected from the group consisting of zirconium (Zr), titanium (Ti), lanthanum (La), and tungsten (W).

8. The ferroelectric thin film fabrication method of claim 1, wherein the ferroelectric layer is made of a ferroelectric material of $A'Bi_bM_cO_{(2+3b+5c)/2}$, in which A' is Ba, Sr or Pb and M is Ti, Ta or Nb.

9. The ferroelectric thin film fabrication method of claim 1, wherein the ferroelectric layer is $Bi_{4-x}La_xTi_3O_{12}(x=0\sim4)$.

10. The ferroelectric thin film fabrication method of claim 1, wherein the ferroelectric layer is formed by sol-gel process, sputtering process, metal-organic chemical vapor deposition process or metal-organic decomposition process.

11. The ferroelectric thin film fabrication method of claim 1, wherein the ion damage processing is performed using an ion mass doping system.

* * * * *